United States Patent [19]
Hauser et al.

[11] Patent Number: 5,418,885
[45] Date of Patent: May 23, 1995

[54] THREE-ZONE RAPID THERMAL PROCESSING SYSTEM UTILIZING WAFER EDGE HEATING MEANS

[75] Inventors: John R. Hauser, Raleigh; Furman Y. Sorrell, Cary; Jimmie J. Wortman, Chapel Hill, all of N.C.

[73] Assignee: North Carolina State University, Raleigh, N.C.

[21] Appl. No.: 998,149

[22] Filed: Dec. 29, 1992

[51] Int. Cl.$^6$ .............. F26B 19/00; A21B 2/00; H01L 21/00
[52] U.S. Cl. .................. 392/416; 392/411; 219/390; 118/724; 427/557
[58] Field of Search .......... 392/416, 418, 422, 411; 219/390, 405, 411; 118/724, 725, 728–730; 437/247, 248; 427/557, 559

[56] References Cited

U.S. PATENT DOCUMENTS

| | | | |
|---|---|---|---|
| 4,469,529 | 9/1984 | Mimura | 392/416 |
| 4,470,369 | 9/1984 | Edgerton | 118/725 |
| 4,481,406 | 11/1984 | Muka . | |
| 4,560,420 | 12/1985 | Lord . | |
| 4,680,451 | 7/1987 | Gat et al. | 219/411 |
| 4,818,327 | 4/1989 | Davis et al. . | |
| 4,956,538 | 9/1990 | Moslehi . | |
| 4,981,815 | 1/1991 | Kakoschke | 437/248 |
| 4,988,533 | 1/1991 | Freeman et al. . | |
| 5,001,327 | 3/1991 | Hirasawa et al. | 219/390 |
| 5,108,792 | 4/1992 | Anderson et al. | 118/725 |
| 5,179,677 | 1/1993 | Anderson et al. | 392/411 |
| 5,252,132 | 10/1993 | Oda et al. | 118/725 |

FOREIGN PATENT DOCUMENTS

| | | | |
|---|---|---|---|
| 2653215 | 4/1991 | France | 392/411 |
| 60-32317 | 2/1985 | Japan . | |
| 60-236217 | 11/1985 | Japan | 118/728 |
| 63-124518 | 5/1988 | Japan | 118/728 |
| 63-161610 | 7/1988 | Japan | 118/728 |
| 63-232422 | 9/1988 | Japan . | |
| 63-278227 | 11/1988 | Japan | 118/724 |
| 4-114429 | 4/1992 | Japan | 118/724 |
| 4-343220 | 11/1992 | Japan | 118/724 |

OTHER PUBLICATIONS

*A Cylindrical Tube Based Rapid Thermal Processor,* D. T. Chapman et al., 179th Electrochemical Society Meeting, No. 358, pp. 541–550, May 1991.
*Temperature Uniformity in RTP Furances,* F. Yates Sorrell et al., IEEE Transactions on Electron Devices, vol. 39, No. 1, Jan. 1992, pp. 75–79.

*Primary Examiner*—John A. Jeffery
*Attorney, Agent, or Firm*—Bell, Seltzer, Park & Gibson

[57] ABSTRACT

A three zone rapid thermal processing system includes three arrays of radiant heating lamps for heating a semiconductor wafer. The arrays are positioned along the axis of the wafer such that one array is adjacent one face of the wafer, the second array is adjacent the second face of the wafer and the third array is adjacent the edge of the wafer. A wafer holder holds the wafer face transverse to the common axis of the radiant heating lamps. Reflectors at each array reflect radiant heat onto the wafer. The arrays are independently connected to power sources and a controller to provide efficient coupling of the heat sources and a uniform temperature distribution across a wafer.

19 Claims, 13 Drawing Sheets

THREE-ZONE RAPID THERMAL PROCESSING SYSTEM UTILIZING WAFER EDGE HEATING MEANS

FIELD OF THE INVENTION

This invention relates to thermal processing systems for fabricating semiconductor wafers and other microelectronic devices, and more particularly to rapid thermal processing systems for semiconductor wafer manufacturing.

BACKGROUND OF THE INVENTION

Rapid thermal processing systems are being increasingly used for microelectronic device fabrication. As is well known to those having skill in the art, rapid thermal processing systems attain a desired processing temperature rapidly, without the need for a lengthy "ramp-up" period. It has been found that rapid thermal processing systems allow microelectronic devices to be fabricated at high temperatures without causing dopant diffusion or other unwanted side effects. Since rapid thermal processing systems typically process semiconductor wafers, the term "wafer" will be used herein to designate any device processed in the rapid thermal processing system. It will be understood by those having skill in the art that other substrates or materials may be processed.

In contrast with a conventional furnace which typically uses resistive heating units, a rapid thermal processing system typically uses radiant heat sources, for example, arc lamps or tungsten-halogen lamps. A small processing chamber is typically used, to provide a controlled environment for the wafer to be processed and to efficiently couple the heat energy from the radiant energy sources to the wafer. Rapid thermal processing systems have heretofore been used for rapid thermal annealing and rapid thermal oxidation of semiconductor wafers. More recently, rapid thermal processing systems have also been used in rapid thermal chemical vapor deposition processes.

Two major design considerations in a rapid thermal processing system are heating efficiency and temperature uniformity. Efficient coupling of the radiant heat from the lamps to the wafer is necessary so that large increases in wafer temperature can be produced in a short time. Moreover, in producing the rapid increase in wafer temperature, a uniform temperature distribution must be provided across the face of the wafer. Lack of uniformity can produce excessive microelectronic device variation across the face of the wafer or may render the wafer unusable because of internal crystalline dislocations or even wafer cracking.

Conventional rapid thermal processing systems use a cylindrical quartz tube as a thermal processing chamber, with a wafer holder for holding the wafer face transverse to the axis to the tube. One or more lamps is placed above and/or below the wafer, to radiate onto the face of the wafer. See, for example, U.S. Pat. No. 4,481,406 to Muka entitled *Heater Assembly for Thermal Processing of a Semiconductor Wafer in a Vacuum Chamber;* U.S. Pat. No. 4,560,420 to Lord entitled *Method for Reducing Temperature Variations Across a Semiconductor Wafer During Heating*, and U.S. Pat. No. 4,818,327 to Davis et al. entitled *Wafer Processing Apparatus.*

Rapid thermal processing system with lamps above and/or below the face of the wafer can efficiently couple radiant energy from the lamps to the wafer face. Unfortunately, poor thermal uniformity across the face of the wafer is often present.

Recently, a rapid thermal processing system has been proposed, in which an array of lamps extend in a cylinder around the edge of the wafer. See a publication entitled *A Cylindrical Tube Based Rapid Thermal Processor* by D. T. Chapman et al., including the present inventors, Extended Abstracts of the 179th Electrochemical Society Meeting, No. 358, pp. 541, May 1991, the disclosure of which is hereby incorporated herein by reference. Unfortunately, although this design results in improved temperature uniformity, coupling efficiency between the radiant sources and the wafer is low. Therefore, this configuration may not produce as high a wafer temperature, or as rapid a temperature increase, as is desirable.

SUMMARY OF THE INVENTION

It is therefore an object of the invention to provide an improved rapid thermal processing system.

It is another object of the present invention to provide a rapid thermal processing system which efficiently couples radiant energy from the radiant sources to the wafer face.

It is still another object of the present invention to provide a rapid thermal processing system which provides a uniform temperature distribution across the wafer.

These and other objects are provided, according to the present invention, by a rapid thermal processing system which includes three arrays of radiant heating lamps arranged about the wafer. The wafer is supported by a wafer holder that orients the wafer such that its opposing faces define an imaginary axis through the center of the wafer and perpendicular to the wafer surfaces. The arrays are symmetrically arranged about the wafer axis and are positioned along the axis such that the first heating lamp array is adjacent one face of the wafer, the second heating lamp array is adjacent the second face and the third heating lamp array is adjacent the edge of the wafer.

In particular, a thermal processing chamber, preferably a cylindrical quartz tube, surrounds the wafer holder and has an axis which is coincident with the axis of the wafer. The chamber can be evacuated or filled with processing gasses as may be desired. The wafer holder preferably includes a wafer support extending transverse to the coincident axes of the wafer, heating lamp arrays and cylindrical chamber. The wafer holder also includes means for moving the wafer holder along the coincident axes for entry and removal of the wafer and for positioning the wafer within the chamber relative to the heating lamp arrays.

Each heating lamp array includes a plurality of elongated radiant heating lamps that are preferably radially symmetric about the wafer axis. The first array has a plurality of elongated lamps, mounted so that the axes of the lamps form a plane parallel to the upper face of the wafer, and directs heat onto the upper face of the wafer. In one embodiment of the present invention, the axis of each lamp is inclined at an oblique angle relative to the upper face of the wafer.

The temperature distribution through the wafer in an axial direction is uniform due to heat conduction through the thin wafer. It is difficult, however, to position a single array of lamps adjacent to the wafer such that it is capable of maintaining a uniform temperature in a radial direction across the wafer. The edge of the wafer has an additional cooling surface that results in wafer temperatures that are higher at the center than at the outer portions of the wafer.

The second array has a plurality of elongated lamps that are also mounted parallel to the wafer axis and may preferably include two spaced apart rows of lamps. This array is adjacent the second face of the wafer and provides additional heating to the wafer as needed, primarily by directing heat onto the lower face of the wafer.

The third array has a plurality of elongated lamps that are mounted so that the axes of the lamps are parallel to the axis of the wafer. This array is adjacent to the edge of the wafer and compensates for the heat loss from the edge. Accordingly, a uniform temperature distribution may be maintained across the wafer.

Energy is supplied to the heating lamp arrays independently so that the relative heat flux from each array can be controlled. Therefore, the heat flux distribution at the wafer can be adjusted to ensure a uniform temperature distribution for different operating parameters of the wafer and heating apparatus. For example, wafers of different thicknesses, diameters and compositions can be accounted for by varying the relative distribution of energy to the heating arrays. In addition, a uniform temperature distribution can be maintained if the type or temperature of the ambient gasses or the desired processing temperature of the wafer are varied. The relative power distribution supplied to the arrays can also be varied over time to ensure wafer temperature uniformity during heat-up and cool-down of the heating apparatus.

The processing gasses used in rapid thermal processing systems often enter the chamber through an inlet located on the wall of the chamber. The influx of these gasses cools portions of the wafer so that the temperature distribution of the wafer is non-uniform about its axis. In an embodiment of the present invention, each of the heating arrays is divided into a number of azimuthal zones that heat separate portions of the wafer about its axis. The power distribution to each of these azimuthal zones can be adjusted to counteract the cooling effect of the processing gasses and to maintain temperature uniformity throughout the wafer.

DETAILED DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
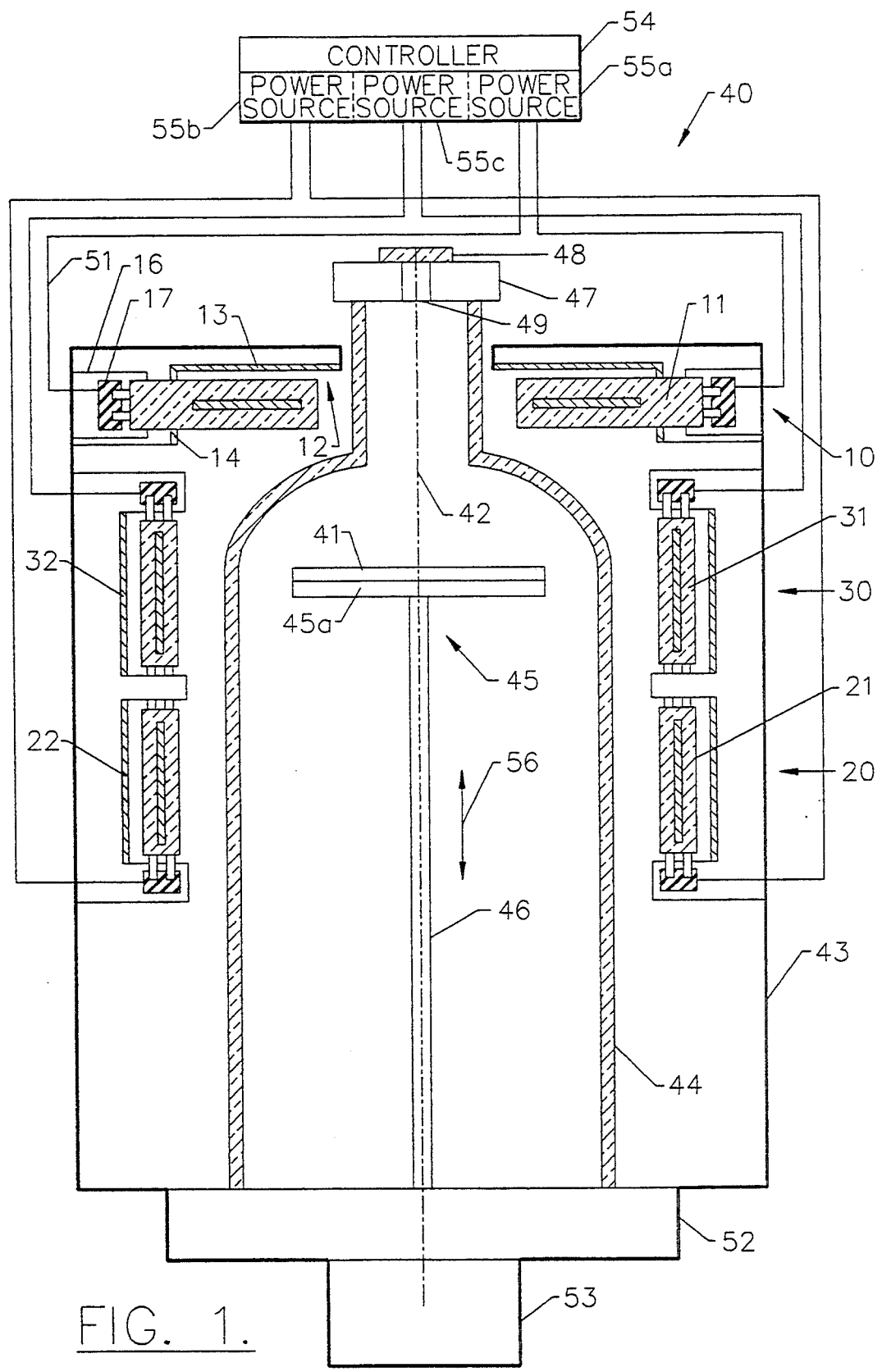
FIG. 1 is a schematic cross-sectional view of a rapid thermal processing apparatus according to the present invention.

Referring now to FIG. 1, there is illustrated a schematic cross-sectional view of a rapid thermal processing apparatus 40 according to the present invention. The rapid thermal system includes three arrays 10, 30, 20 of radiant heating lamps 11, 31, 21 arranged about a semiconductor wafer 41. The three heating arrays 10, 30, 20 each comprise a plurality of elongated radiant heating lamps 11, 31, 21 that are symmetric about an imaginary axis 42 defined by the opposing faces of the wafer. The axis 42 shown in FIG. 1 is vertical although it would be readily understood by one skilled in the art that this axis could be in a different orientation. The radiant heating lamps 11, 31, 21 are preferably linear tungsten-halogen lamps, although other radiant heating means, such as one or more arc lamps or circular lamps, may be used.

Figure 2:
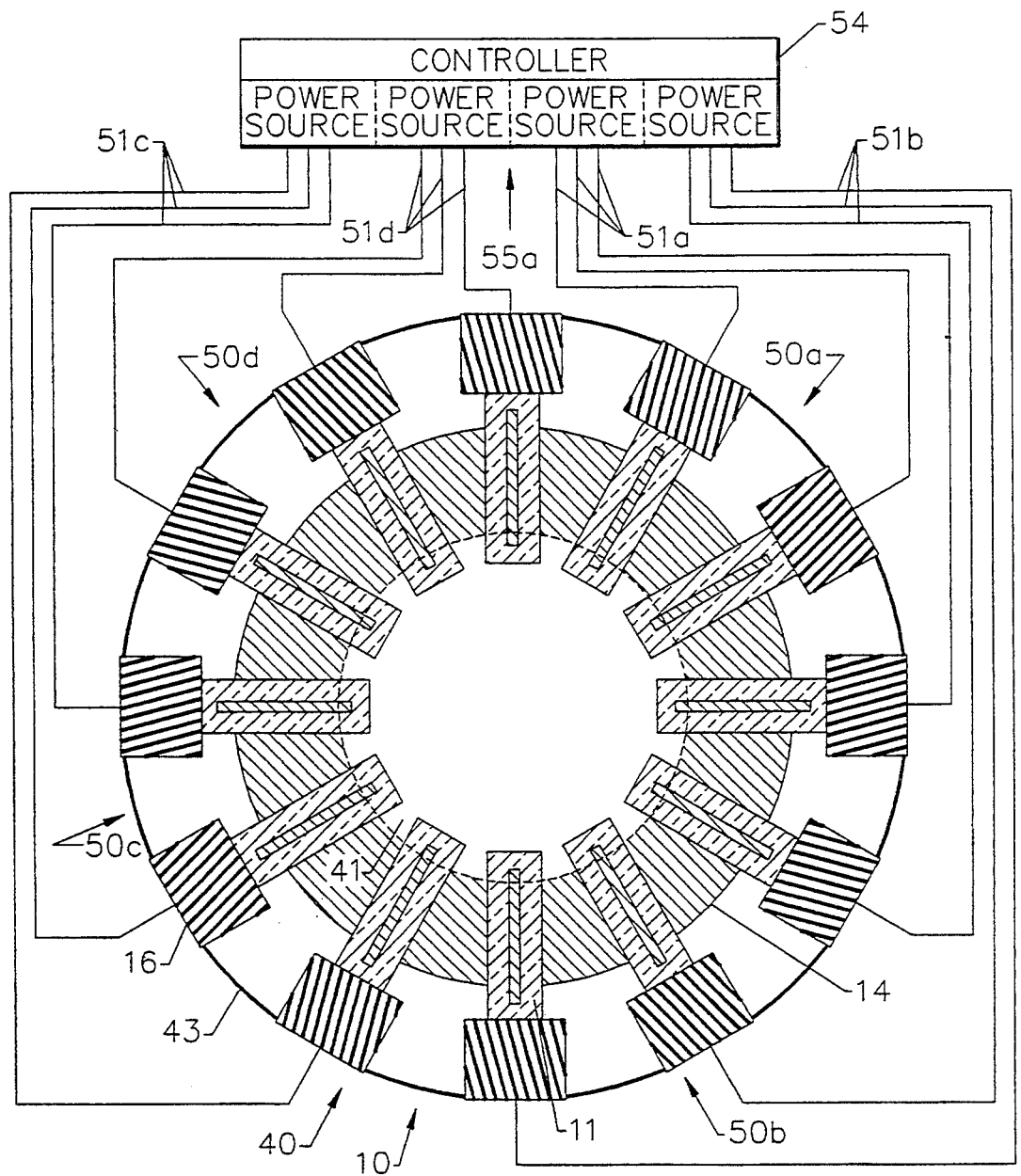
FIG. 2 is a plan view of a rapid thermal processing apparatus according to the present invention.
Figure 4:
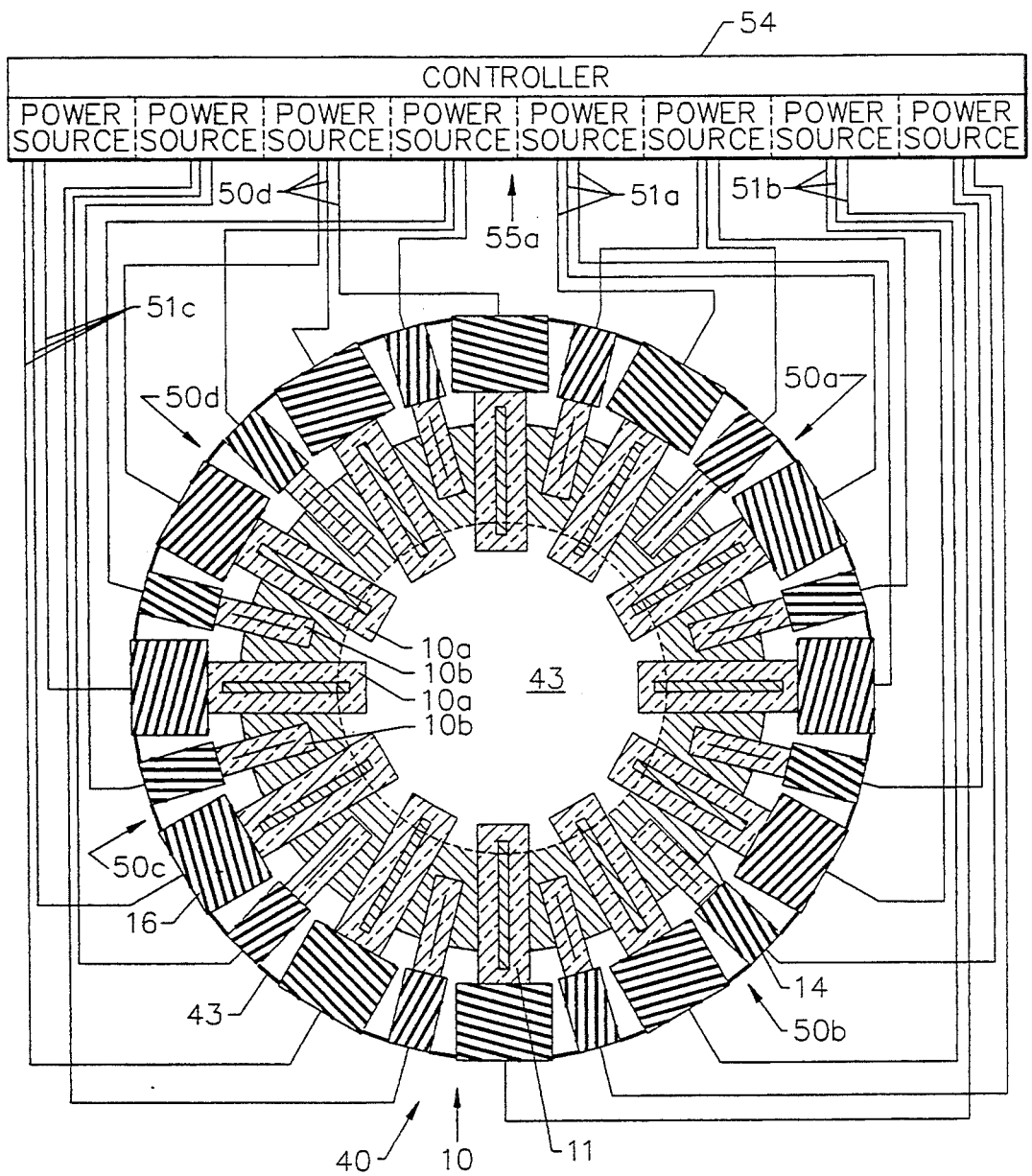
FIG. 4 is a plan view of another embodiment of a rapid thermal processing apparatus according to the present invention.

In the embodiment of FIG. 1, the first array 10 has twelve elongated lamps 11 that are transverse to the imaginary axis 42 so that the axes of the lamps form a plane parallel to the upper face of the wafer 41. Each lamp 11 is also preferably coplanar with the imaginary axis 42 so that the lamps 11 extend radially outward from the axis. As best shown in FIG. 2, the radially outer ends of the lamps 11 are mounted at the apparatus wall 43 and the inner ends meet above the center of the apparatus 40. Conventional brackets or other support means 16 are used to support the lamps. The electrical connectors 17 of the lamps are at the outer ends of the lamps and are connected via wires 51 to a heat lamp energizing means 55a as more fully discussed below. In particular, 1 Kw tungsten-halogen lamps 11 having a filament length of 1.0 inch, such as the USHIO Model FEL, can be used. It would be readily understood by one skilled in the art that more or fewer lamps could be used in this array 10. In addition, a further embodiment of the present invention is shown in FIG. 4 wherein a second sub-array 10b of twelve lamps is interposed between alternating ones of the first sub-array 10a of the first array of lamps 10 and is independently connected to a controller 54 to provide additional heating to the wafer 41 as necessary.

The first array 10 has a reflector 12 that redirects radiant heat from the lamps onto the wafer 41. The reflector 12 surrounds the lamps and has reflecting or perpendicular and parallel to the imaginary axis 42 so as to form a reflective cylinder that has reflective walls 13 and an annular reflective top portion 14. The reflector 12 may be formed of stainless steel, aluminum, or other known materials, and may be plated with gold or other known materials on the reflecting surfaces to increase the reflectivity thereof.

Figure 5:
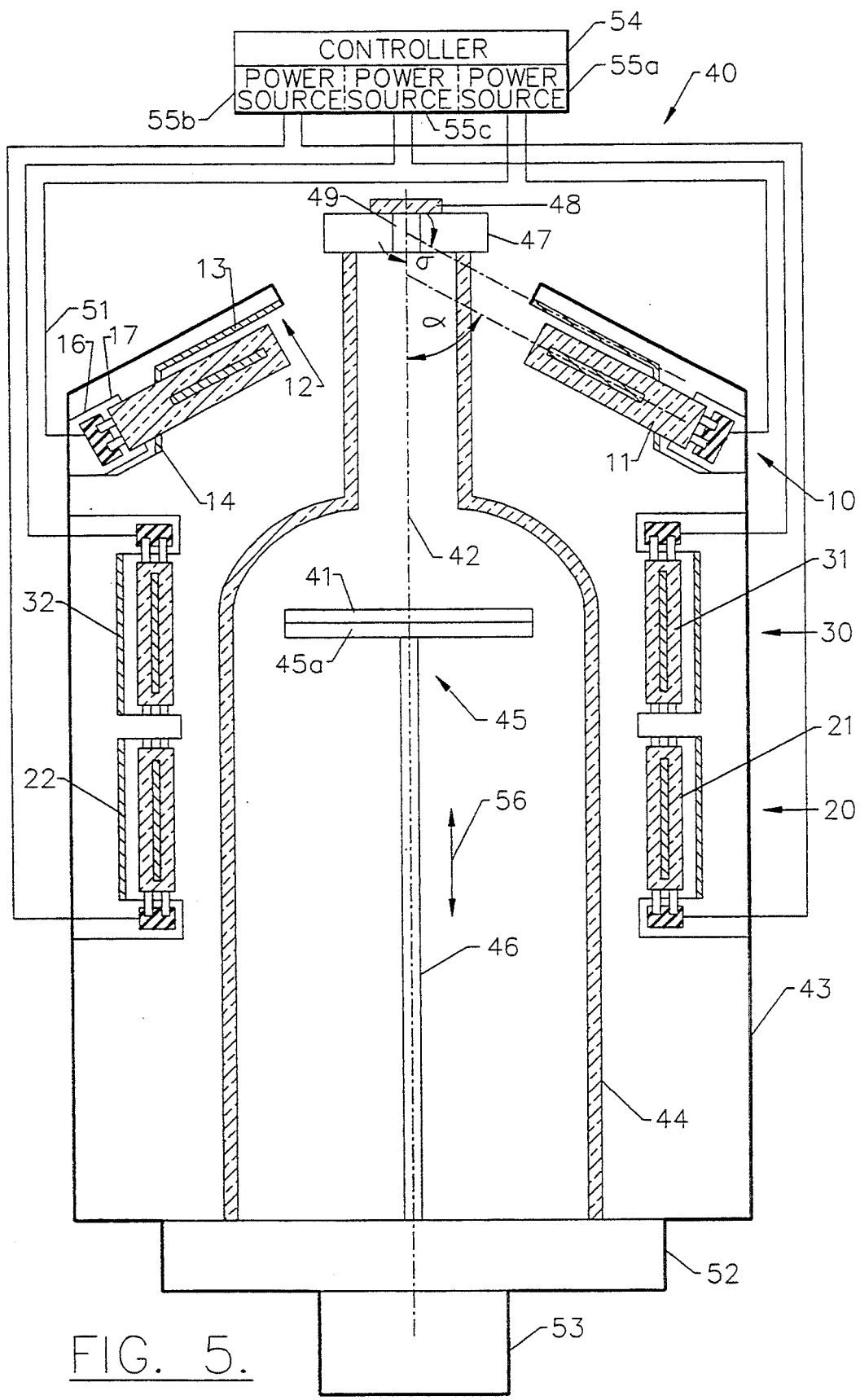
FIG. 5 is a schematic cross-sectional view of another embodiment of a rapid thermal processing apparatus according to the present invention.

In another embodiment of the present invention, as shown in FIG. 5, each lamp 11 may be inclined so that its axis forms an angle $\alpha$ relative to the imaginary axis of the wafer 42. The surface 13 of the reflector 12 perpendicular to the imaginary axis may also be inclined at an angle $\sigma$ relative to the imaginary axis 42 so as to form a reflector with a frusto-conical portion. The lamp and reflector angles $\alpha$, $\sigma$ may be varied as disclosed in co-pending U.S. patent application Ser. No. 07/953,568 entitled *Conical Rapid Thermal Processing Apparatus* and filed on Sep. 29, 1992, the disclosure of which is hereby incorporated herein by reference. The lamp and reflector angles $\alpha$, $\sigma$ are not necessarily equal and may be varied independently.

The first array 10 directs heat flux onto the upper face of the wafer 41 and in the present embodiment provides primary heating for the wafer. As more fully described above, it is desirable to maintain a uniform temperature across the wafer 41 during thermal processing. Thermal conduction from the upper face to the lower face provides a uniform temperature distribution in an axial direction through the wafer 41. It is difficult, however, to ensure a uniform temperature distribution in a radial direction when the heat flux is provided by only a single array of lamps parallel to the upper face of the wafer 41. The edge of the wafer 41 has an additional cooling surface that loses more heat through convection and radiation than does the center of the wafer. This results in a wafer temperature distribution that is higher at the center than at the outer portions of the wafer.

The present invention includes another array of lamps 30 to overcome this problem. The third array 30 has a plurality of elongated lamps 31 that are mounted adjacent to the edge of the wafer 42. In the embodiment shown in FIG. 1, this array has thirty-two lamps 31 adjacent the edge of the wafer 41 such that the plane formed by the wafer intersects the length of a lamp at roughly its midpoint. The lamps 31, shown in the embodiment of FIG. 1 mounted with their axes parallel to the imaginary axis of the wafer, provide a heat flux directly to the edge of the wafer 41 to compensate for the additional heat loss from the edge. A reflector 32 surrounds the third array 31 of lamps and has a reflecting surface that is parallel to the wafer axis 42. The reflector 32 is preferably a continuous surface around the lamps 31 so as to form a reflective cylinder.

In the embodiment of FIG. 1, the second array 20 also has thirty-two elongated lamps 21 that are mounted with their axes parallel to the axis of the wafer 42 and is substantially similar to the third array 30 in terms of relative lamp placement and reflector design. The second array 20, however is below the third array 30 and the lower face of the wafer 41 and provides additional bulk heating to the wafer as necessary. By positioning this array 20 below the wafer 41, the radiant heat flux is such that it produces a very nearly uniform temperature across the wafer in a radial direction as described in a publication by coinventor Sorrell, Fordham, Öztürk and coinventor Wortman entitled *Temperature Uniformity in RTP Furnaces*, published in IEEE Transactions on Electron Devices, Vol. 39, No. 1, January 1992, pp. 75-79, the disclosure of which is hereby incorporated herein by reference. As such, the second 20 and third 30 arrays can provide uniform wafer temperatures even if the first array 10 is not energized, as can the first 10 and third 30 arrays if the second array 20 is not energized. Energizing both the first 10 and second 20 arrays may only be necessary in situations where a greater total heat flux to the wafer 41 is necessary, such as, for example, when a higher processing temperature is desired.

In particular, the second 20 and third 30 arrays use 1 Kw double-ended tungsten-halogen lamps, such as the USHIO model DXW and use conventional brackets or other support means (not shown) to support the lamps. It would be readily understood by one skilled in the art that more or fewer lamps could be used in these arrays 20, 30. A reflector 22 surrounds the second array of lamps and has a reflecting surface that is parallel to the imaginary wafer axis 42. This reflector 22 is also preferably a continuous surface around the lamps 21 so as to form a reflective cylinder.

Figure 3:
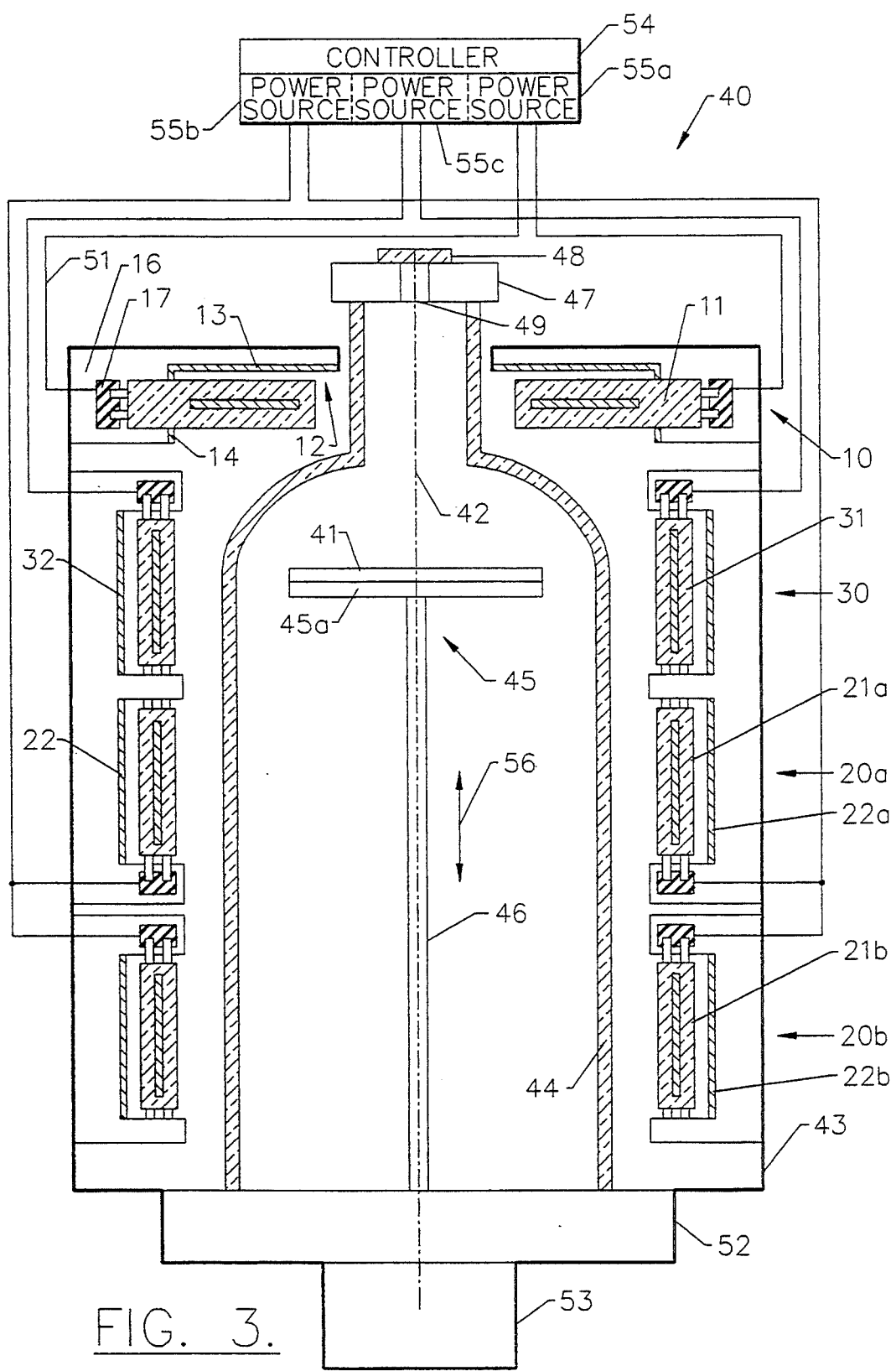
FIG. 3 is a schematic cross-sectional view of another embodiment of a rapid thermal processing apparatus according to the present invention.

The second array 20 may preferably include two rows 20a, 20b of radiant heating lamps spaced apart along the imaginary axis 42 as shown in FIG. 3. The rows 20a, 20b are of the same structure as the single row discussed above and each have a plurality of heating lamps 21a, 21b and a cylindrical reflector 22a, 22b placed around the lamps. It would be readily understood by one skilled in the art that the second array 20 could also include more than two rows of lamps.

As shown in FIG. 1, heat lamp energizing means 55a, 55b, 55c may be used to energize lamps. Heat lamp energizing means includes independently controllable first 55a, second 55b and third 55c energizing means for independently controlling the respective first 11, second 21 and third arrays 31 of heat lamps. The controller 54 is operatively connected to the energizing means 55a, 55b, 55c so that energy can be supplied to the heating arrays independently and the relative heat flux from each array can be controlled. Therefore, the heat flux distribution at the wafer 41 can be adjusted to ensure a uniform temperature distribution as is necessary when the operating parameters of the wafer and heating apparatus are varied, as indicated in the above cited Sorrell et al. publication. For example, wafers of different thicknesses, diameters and compositions can be accounted for by varying the relative distribution of energy to the heating arrays 10, 30, 20. A uniform temperature distribution can be maintained if the type or temperature of the ambient gasses is changed or if the thermal processing chamber 44 is evacuated. In addition, if the desired processing temperature of the wafer 41 is changed, the new temperature can be made constant throughout the wafer. The relative energy distribution supplied to the arrays 10, 30, 20 can also be varied over time to ensure wafer temperature uniformity during heat-up and cool-down of the heating apparatus 40 as described in the above cited Sorrell et al. publication.

In an embodiment of the present invention, each of the heating arrays 10, 30, 20 is divided into a number of azimuthal zones 50a, 50b, 50c, 50d that are independently energized via respective wires 51a, 51b, 51c, 51d. As shown in FIG. 2 for the first array 10 only, the azimuthal zones heat separate portions of the wafer 41 about its axis 42. The energy distribution to each of these azimuthal zones 50 can be adjusted to counteract the cooling effect of the processing gasses that enter the thermal processing chamber 44 from an inlet on the wall of the chamber (not shown).

Referring again to FIG. 1, the thermal processing chamber 44 surrounds a wafer holding means 45. Thermal processing chamber 44 is preferably a cylindrical quartz thermal processing chamber having an axis which is coincident to the wafer axis 42. The heating lamps 11, 31, 21 and reflectors 12, 32, 22 are preferably outside the thermal processing chamber 44.

Wafer holding means 45 is contained within thermal processing chamber 44. Wafer holding 45 means preferably comprises a wafer support 45a having a flat face adapted for receiving one or more wafers thereon. Wafer support 45a preferably extends transverse to axis 42. A wafer positioner 46 preferably extends along axis 42 and allows movement along axis in the directions shown by arrow 56. Movement in the directions shown allows positioning of the wafer 41 within the chamber 44 relative to the heating arrays 10, 30, 20 and also allows insertion and removal of the wafer.

Wafer holding means 45 is preferably coupled to a load lock 52 which includes an access door and other conventional wafer handling systems. A vacuum pump 53 may be used to evacuate chamber when necessary. One or more gas inlets and outlets (not shown) may be provided for pumping reactive and/or nonreactive gasses through chamber 44 using techniques well known to those skilled in the art.

Still referring to FIG. 1, an end cap 47 may be provided to seal the chamber. End cap may be water cooled and preferably includes a glass window 48 thereon and an aperture 49 therein to permit viewing of the wafer 41 in the chamber 44.

Reflectors 12, 32, 22 are preferably surrounded by a water cooling jacket (not shown) which may be cooled via chilled water or other known means through inlets and outlets (not shown). An inlet and outlet (not shown) may also be provided for cooling of end cap 47.

The thermal processing apparatus 40 of FIG. 1, provides improved temperature uniformity compared to a conventional rapid thermal processing apparatus with lamps only above and/or below the wafer face, and provides increased efficiency compared to a known system with only cylindrical lamps and reflectors. Simulations were performed by the inventors to verify that the above described configuration provides sufficient total heating to the wafer so that desired process temperatures can be achieved. Simulations were also performed to determine the uniformity of the temperature distribution across the wafer when heated with the above described configuration.

Figure 6:
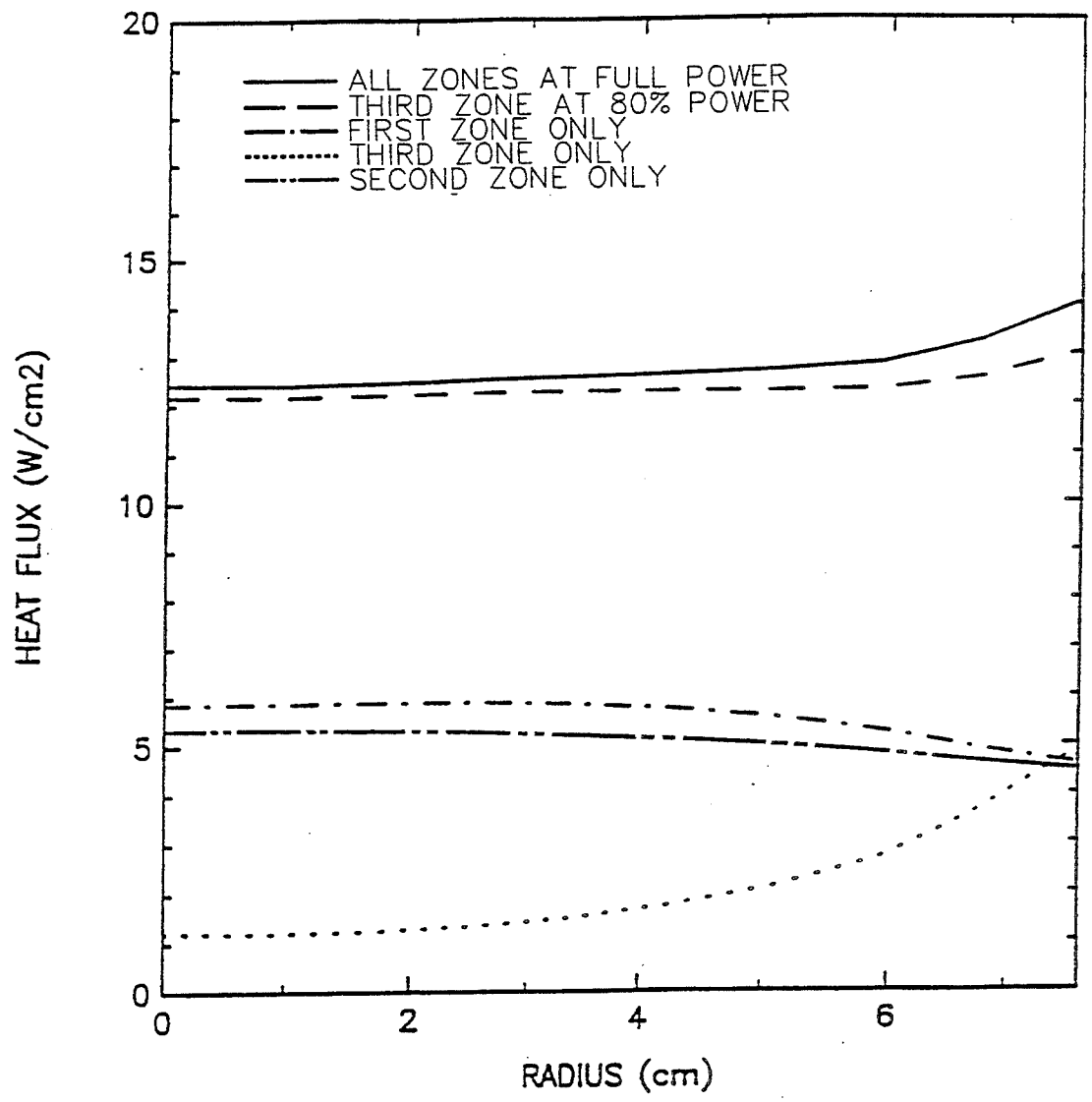
FIG. 6 graphically illustrates heat flux versus wafer radius for the rapid thermal processing apparatus of FIG. 1 when the second array of lamps is 8.8 cm below the wafer.
Figure 7:
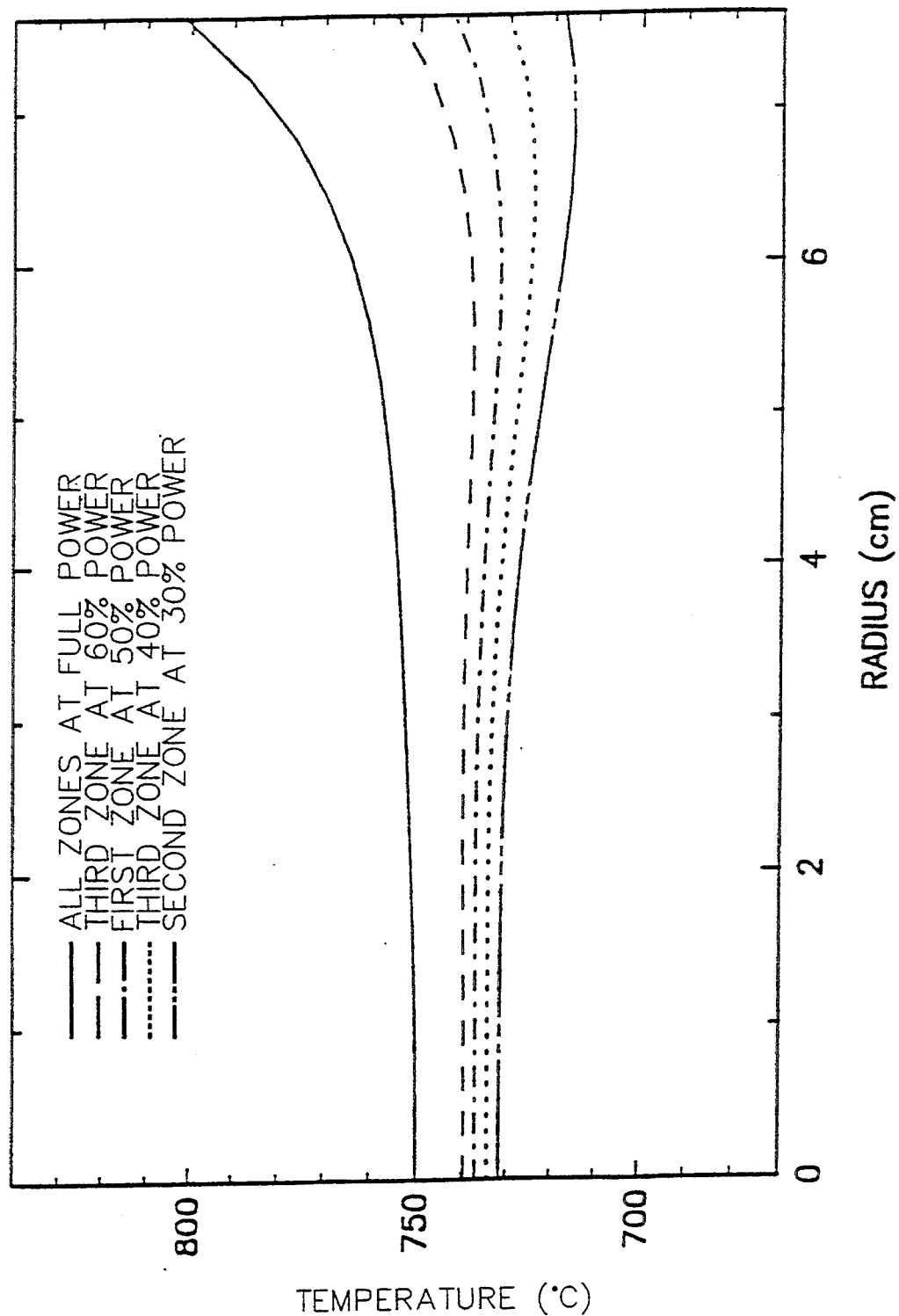
FIG. 7 graphically illustrates wafer temperature versus wafer radius for the rapid thermal processing apparatus of FIG. 1 when the second array of lamps is 8.8 cm below the wafer.
Figure 8:
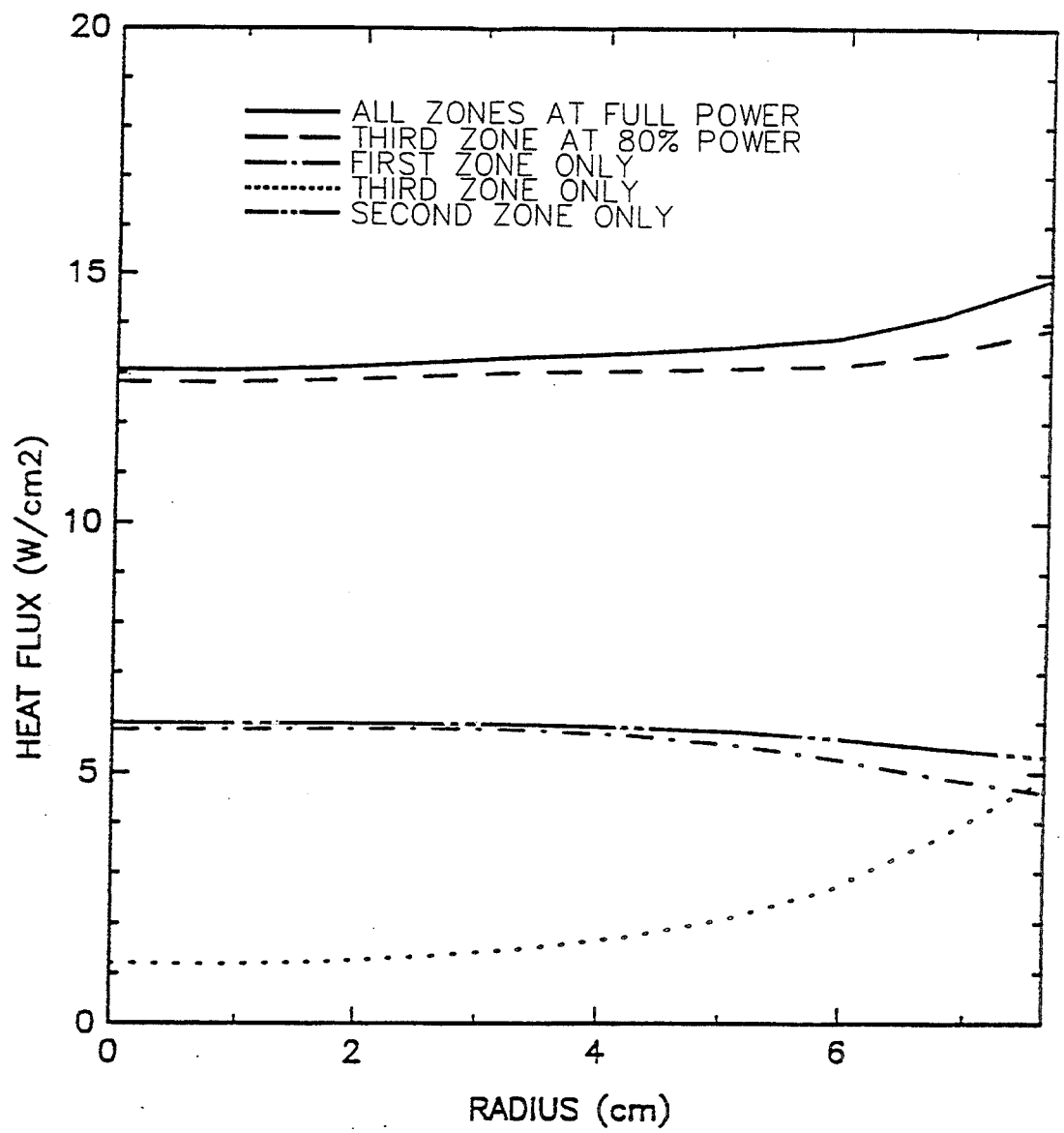
FIG. 8 graphically illustrates heat flux versus wafer radius for the rapid thermal processing apparatus of FIG. 1 when the second array of lamps is 7.5 cm below the wafer.
Figure 9:
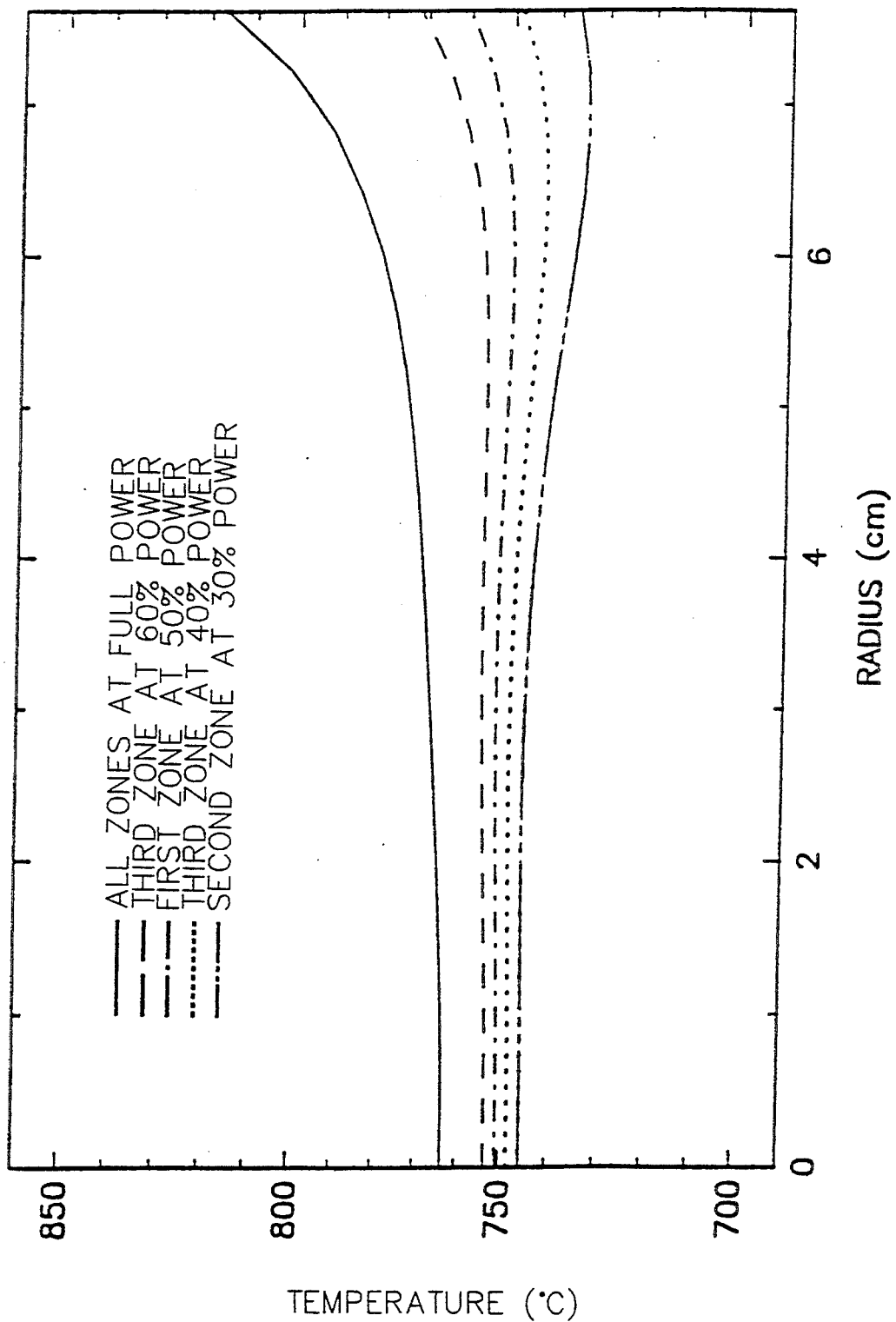
FIG. 9 graphically illustrates wafer temperature versus wafer radius for the rapid thermal processing apparatus of FIG. 1 when the second array of lamps is 7.5 cm below the wafer.
Figure 10:
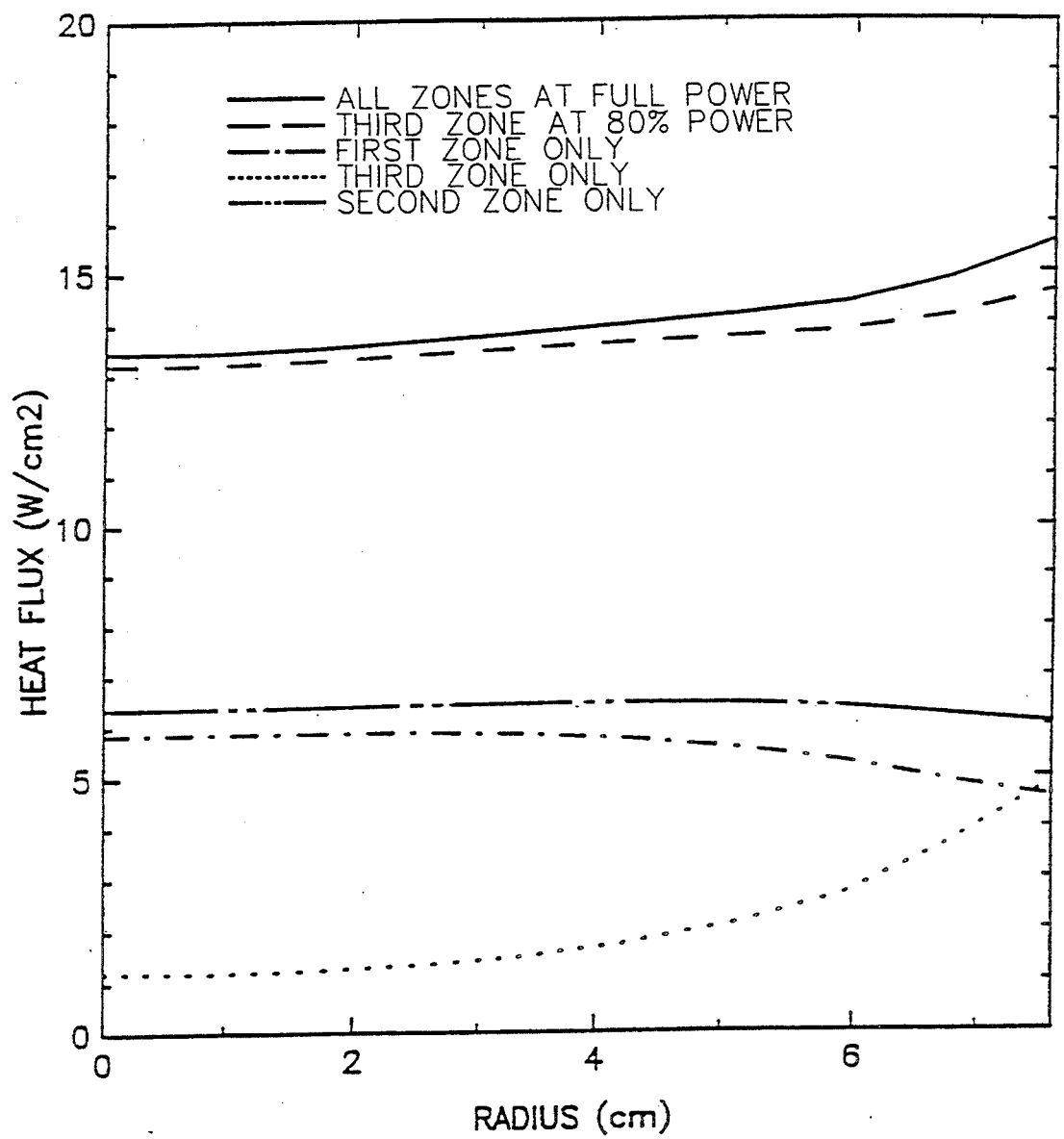
FIG. 10 graphically illustrates heat flux versus wafer radius for the rapid thermal processing apparatus of FIG. 1 when the second array of lamps is 6.5 cm below the wafer.
Figure 11:
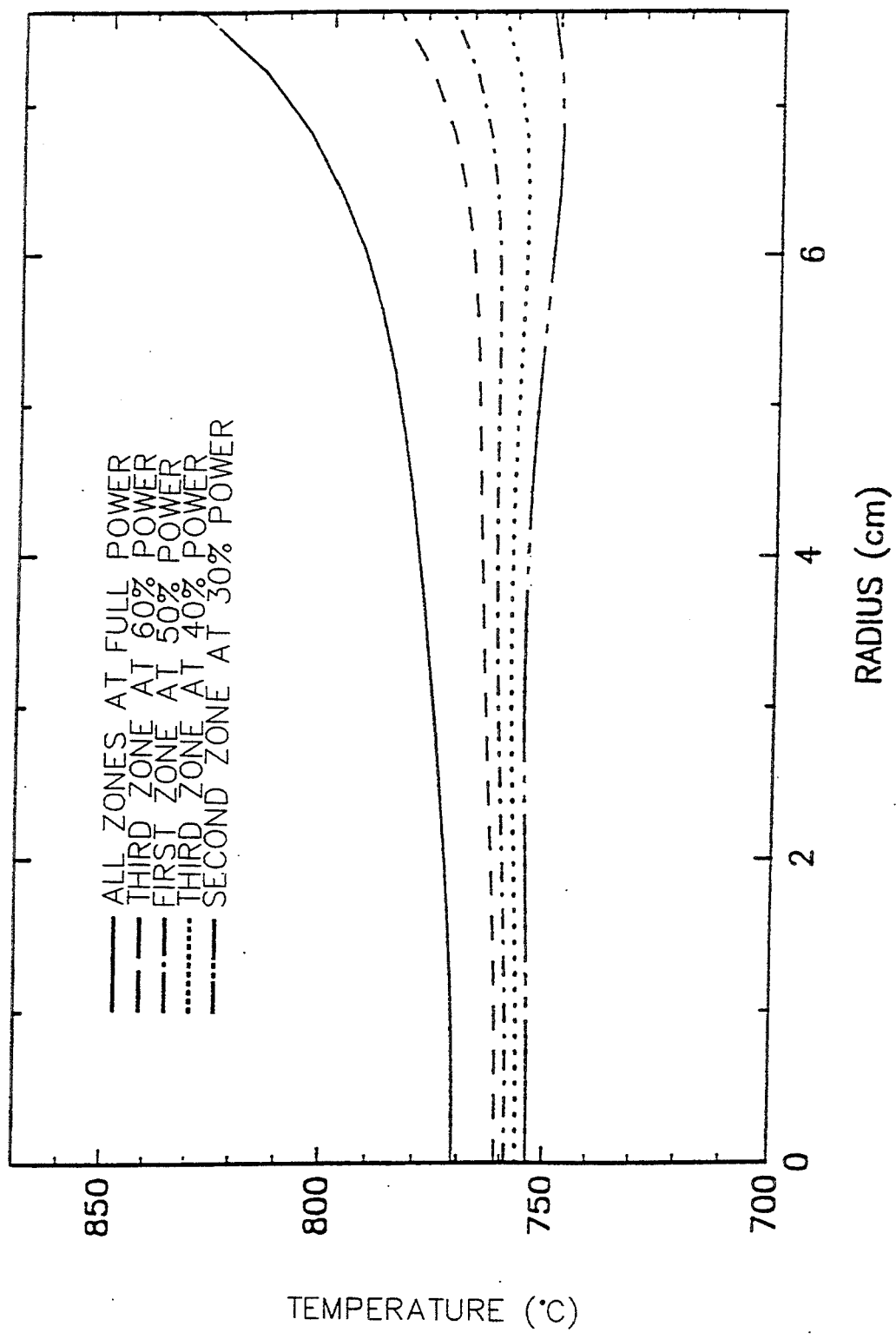
FIG. 11 graphically illustrates wafer temperature versus wafer radius for the rapid thermal processing apparatus of FIG. 1 when the second array of lamps is 6.5 cm below the wafer.
Figure 12:
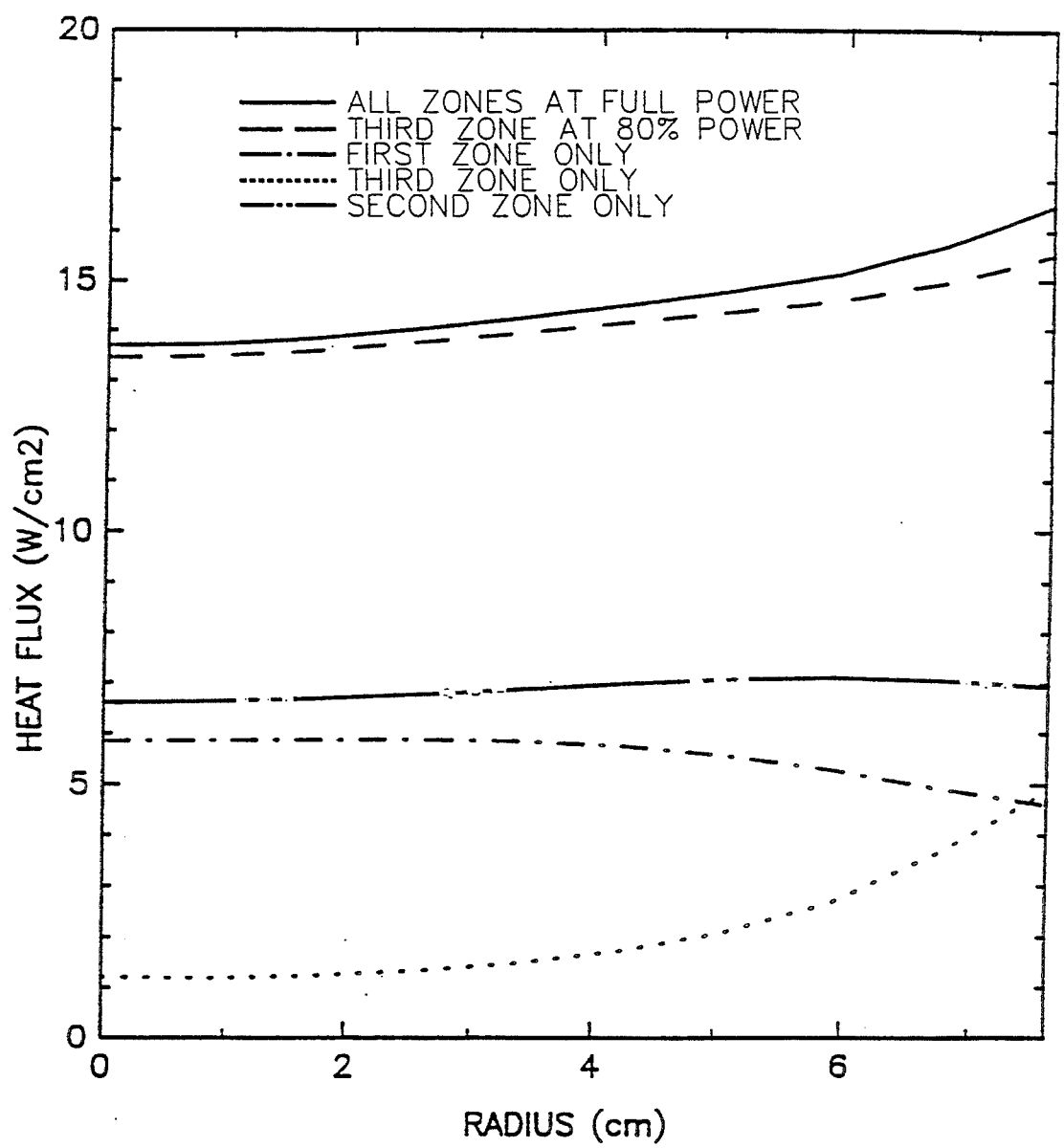
FIG. 12 graphically illustrates heat flux versus wafer radius for the rapid thermal processing apparatus of FIG. 1 when the second array of lamps is 5.5 cm below the wafer.
Figure 13:
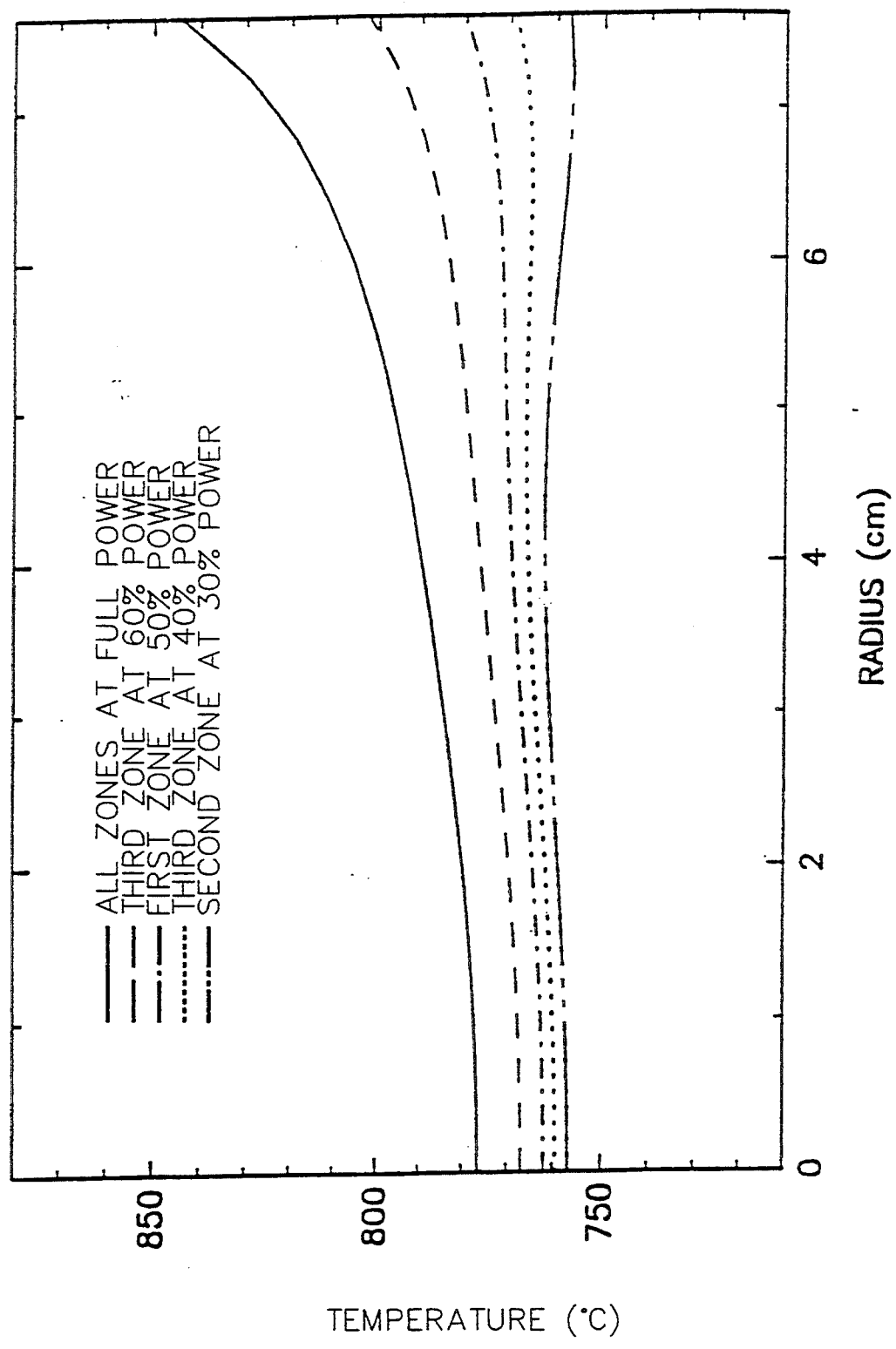
FIG. 13 graphically illustrates wafer temperature versus wafer radius for the rapid thermal processing apparatus of FIG. 1 when the second array of lamps is 5.5 cm below the wafer.

FIGS. 6–13 graphically illustrate the heat flux and wafer temperature distributions obtained when using the apparatus of the present invention to heat a silicon wafer with a diameter of six inches. The figures show heat flux (W/cm$^2$) and temperatures (C. °) at points along a radius (cm) from the center of the wafer to the edge. FIGS. 6 and 7 show heat flux and temperature distributions for the apparatus of the present invention when the second array 20 of lamps is located 8.8 centimeters below the wafer. The lines on the graph illustrate the effects on heat flux and temperature distribution of varying the amount of energy supplied to each array, as shown by the legends on each graph. FIGS. 8 and 9 show heat flux and temperature distributions when the second array 20 of lamps is located 7.5 centimeters below the wafer. FIGS. 10 and 11 show heat flux and temperature distributions for the present apparatus when the second array 20 is located 6.5 centimeters below the wafer. FIGS. 12 and 13 show heat flux and temperature distributions when the second 20 array of lamps is located 5.5 centimeters below the wafer. Accordingly, it has been shown that the three array rapid thermal processing system 40 of the present invention can provide high coupling efficiency and high wafer temperatures, while providing uniform temperatures across the wafer.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An apparatus for thermally processing a wafer having first and second opposing faces and a wafer edge therebetween, said apparatus comprising:

means for holding a wafer such that the first and second opposing faces thereof define an imaginary axis transverse thereto;

first radiant heating means, radially symmetrically arranged about the imaginary axis and encircling the imaginary axis, adjacent the first face and opposite the second face;

second radiant heating means, radially symmetrically arranged about the imaginary axis and encircling the imaginary axis, adjacent the second face and opposite the first face; and third radiant heating means, radially symmetrically extending axially about the imaginary axis and encircling the imaginary axis, between said first and said second radiant heating means, adjacent the wafer edge and extending beyond the first and second opposing faces.

2. The apparatus of claim 1 wherein said first radiant heating means comprises a plurality of spaced apart elongated radiant heating lamps, extending radially about the imaginary axis, adjacent the first face and opposite the second face.

3. The apparatus of claim 2 wherein said plurality of spaced apart radiant heating lamps, adjacent the first face and opposite the second face, extend radially about the imaginary axis and at an oblique angle thereto.

4. The apparatus of claim 3 wherein said second radiant heating means comprises a plurality of elongated radiant heating lamps, extending axially about the imaginary axis, adjacent the second face and opposite the first face.

5. The apparatus of claim 4 wherein said third radiant heating means comprises a plurality of elongated radiant heating lamps, extending axially about the imaginary axis, between said first and second radiant heating means and adjacent the edge of the wafer.

6. The apparatus of claim 1 further comprising reflecting means, adjacent said first, second and third radiant heating means and opposite said wafer holding means.

7. The apparatus of claim 6 wherein said reflecting means adjacent said first radiant heating means comprises a reflective cylinder having a reflective wall and a reflective top portion.

8. The apparatus of claim 6 wherein said reflecting means adjacent said second and third radiant heating means comprise reflective cylinders each having a reflective wall.

9. The apparatus of claim 1 further comprising a thermal processing chamber surrounding said wafer holding means, between said wafer holding means and said first, second and third radiant heating means.

10. The apparatus of claim 9 wherein said wafer holding means comprises;
a wafer support extending transverse to the imaginary axis; and
means for moving said wafer support along the imaginary axis.

11. The apparatus of claim 1 further comprising means for independently energizing said first, second and third radiant heating means.

12. The apparatus of claim 1 further comprising means for independently energizing a plurality of azimuthal zones of said first, second and third radiant heating means.

13. An apparatus for thermally processing a wafer having first and second opposing faces and a wafer edge therebetween, said apparatus comprising:
means for holding a wafer such that the first and second opposing faces thereof define an imaginary axis transverse thereto;
a first array of equally spaced apart elongated radiant heating lamps, radially symmetrically extending radially about the imaginary axis and encircling the imaginary axis, adjacent the first face and opposite the second face;
a second array of equally spaced apart elongated radiant heating lamps, radially symmetrically extending axially about the imaginary axis and encircling the imaginary axis, adjacent the second face and opposite the first face; and
a third array of equally spaced apart elongated radiant heating lamps, radially symmetrically extending axially about the imaginary axis and encircling the imaginary axis, between the first and second radiant heating lamps and adjacent the edge of the wafer.

14. The apparatus of claim 13, wherein said first, second and third arrays are first, second and third arrays of linear radiant heating lamps.

15. The apparatus of claim 14 wherein said first array of spaced apart elongated radiant heating lamps, adjacent the first face and opposite the second face, extend radially about said imaginary axis and at an oblique angle thereto.

16. The apparatus of claim 15 wherein said second array comprises a first and a second row of heating lamps, each extending axially about the imaginary axis, adjacent the second face and opposite the first face.

17. The apparatus of claim 16 wherein said first row is between said second row and the first face.

18. The apparatus of claim 13 further comprising means for independently energizing sub-arrays of the heating lamps in said first array.

19. An apparatus for thermally processing a wafer having first and second opposing faces and a wafer edge therebetween, said apparatus comprising:
means for holding a wafer such that the first and second opposing faces thereof define an imaginary axis transverse thereto;
a first array of equally spaced apart linear radiant heating lamps, radially symmetrically extending radially about the imaginary axis and encircling the imaginary axis, adjacent the first face and opposite the second face;
a second array of equally spaced apart linear radiant heating lamps, radially symmetrically extending axially about the imaginary axis and encircling the imaginary axis, adjacent the wafer holding means; and
a third array of equally spaced apart linear radiant heating lamps, radially symmetrically extending axially about the imaginary axis and encircling the imaginary axis, between the first and second linear radiant heating lamps.

* * * * *